(12) United States Patent
Jiang et al.

(10) Patent No.: US 9,743,549 B2
(45) Date of Patent: Aug. 22, 2017

(54) LOCKING ASSEMBLY FOR SECURING ELECTRONIC EQUIPMENT WITHIN AN EQUIPMENT RACK

(71) Applicant: SCHNEIDER ELECTRIC IT CORPORATION, West Kingston, RI (US)

(72) Inventors: Yuchun Jiang, Saint Peters, MO (US); Daniel J. Rohr, Wildwood, MO (US); Gregory Scott Ivey, Lake St. Louis, MO (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 454 days.

(21) Appl. No.: 14/548,015

(22) Filed: Nov. 19, 2014

(65) Prior Publication Data

US 2015/0135783 A1 May 21, 2015

Related U.S. Application Data

(60) Provisional application No. 61/907,093, filed on Nov. 21, 2013.

(51) Int. Cl.
*E05C 19/18* (2006.01)
*H05K 7/14* (2006.01)
*E05C 19/00* (2006.01)

(52) U.S. Cl.
CPC ......... *H05K 7/1489* (2013.01); *H05K 7/1492* (2013.01); *Y10S 292/53* (2013.01);
(Continued)

(58) Field of Classification Search
CPC ..... Y10S 292/53; Y10S 292/54; Y10S 292/64
(Continued)

(56) References Cited

U.S. PATENT DOCUMENTS 4,547,835 A * 10/1985 Pansaerts ................ E05B 65/46
361/759
4,662,664 A * 5/1987 Wendt .................... A47K 10/36
292/19
(Continued)

FOREIGN PATENT DOCUMENTS

CN 2718975 Y 8/2005
CN 2837915 Y 11/2006
(Continued)

OTHER PUBLICATIONS

Extended European Search Report from corresponding European Application No. 14193538.7 dated Jul. 8, 2015.
(Continued)

*Primary Examiner* — Carlos Lugo
(74) *Attorney, Agent, or Firm* — Lando & Anastasi, LLP

(57) ABSTRACT

A locking assembly is provided for securing an electronic module to a chassis of a rack enclosure within a mounting slot of the chassis. The locking assembly includes a lock configured to be secured to a vertical rail of the chassis. The lock further is configured to prevent the electronic module from being slidably installed into and removed from its respective mounting slot and to prevent a latch of the electronic module from being opened when the electronic module is secured in place within the chassis of the rack enclosure. The locking assembly further includes a key configured to enable the lock to be removed from the chassis thereby enabling the installation and removal of the electronic module from the chassis.

17 Claims, 7 Drawing Sheets

(52) U.S. Cl.
CPC .... *Y10T 29/49817* (2015.01); *Y10T 29/49876* (2015.01); *Y10T 29/49947* (2015.01); *Y10T 70/7486* (2015.04)

(58) Field of Classification Search
USPC ....... 292/80, 81, 87, 88, 288, 300, 303, 346; 70/58, 77–85; 361/801
See application file for complete search history.

(56) References Cited

U.S. PATENT DOCUMENTS

| | | | | |
|---|---|---|---|---|
| 4,673,100 A * | 6/1987 | Reis | ..................... | H05K 5/0013 220/284 |
| 4,917,618 A * | 4/1990 | Behrens | ............... | H05K 7/1409 439/157 |
| 5,317,483 A * | 5/1994 | Swindler | ................. | G06F 1/184 361/752 |
| 5,348,356 A * | 9/1994 | Moulton | ................. | E05B 37/20 292/80 |
| 5,363,281 A * | 11/1994 | Baitz | ..................... | G06K 19/067 361/740 |
| 5,601,349 A * | 2/1997 | Holt | ......................... | G06F 1/184 174/67 |
| 5,622,064 A * | 4/1997 | Gluskoter | ............. | E05C 19/003 248/551 |
| 5,634,675 A * | 6/1997 | Mo | ......................... | E05C 19/06 220/284 |
| 5,931,514 A * | 8/1999 | Chung | ..................... | F16B 12/26 220/326 |
| 6,138,839 A * | 10/2000 | Cranston, III | ........... | G06F 1/184 211/41.17 |
| 6,281,433 B1 * | 8/2001 | Decker | ................. | H05K 9/0015 174/394 |
| 6,288,902 B1 * | 9/2001 | Kim | ........................ | G11B 33/08 206/701 |
| 6,390,320 B2 * | 5/2002 | Hurst | .................... | H05K 9/0016 174/365 |
| 6,549,424 B1 * | 4/2003 | Beseth | ................. | H05K 7/1409 361/726 |
| 6,608,765 B2 * | 8/2003 | Vier | ...................... | H05K 7/1429 361/752 |
| 7,021,682 B2 * | 4/2006 | Erickson | ............... | E05B 65/006 292/204 |
| 8,503,184 B2 * | 8/2013 | Hanna | ..................... | G06F 1/186 361/747 |
| 2003/0039104 A1 | 2/2003 | Joist et al. | | |
| 2004/0012924 A1 | 1/2004 | Hanson et al. | | |
| 2005/0052856 A1 | 3/2005 | Williams | | |
| 2005/0094370 A1 * | 5/2005 | Franz | ...................... | G06F 1/184 361/679.32 |
| 2006/0107711 A1 * | 5/2006 | Taya | .................... | E05B 73/0023 70/58 |
| 2006/0267465 A1 | 11/2006 | Hung et al. | | |
| 2008/0030962 A1 | 2/2008 | Kunkle et al. | | |
| 2009/0147459 A1 | 6/2009 | Nguyen et al. | | |
| 2011/0279973 A1 | 11/2011 | Terwilliger et al. | | |

FOREIGN PATENT DOCUMENTS

| | | | |
|---|---|---|---|
| CN | 101485240 A | | 7/2009 |
| DE | 2406749 | * | 1/1975 |
| DE | 2647362 A1 | | 4/1978 |
| EP | 1282349 A1 | | 2/2003 |
| FR | 2447299 A1 | | 8/1980 |

OTHER PUBLICATIONS

Installation Instructions for Modular Power Distribution Unit—208/120 V with Input and Subfeed Breaker, APC by Schneider Electric, 2011, 4 pages.
Installation Instructions for Power Distribution Module with L6-30 Output, APC by Schneider Electric, 2011, 2 pages.

* cited by examiner

LOCKING ASSEMBLY FOR SECURING ELECTRONIC EQUIPMENT WITHIN AN EQUIPMENT RACK

CROSS-REFERENCE TO RELATED APPLICATIONS

This application claims priority to U.S. Provisional Patent Application No. 61/907,093 filed Nov. 21, 2013, entitled LOCKING ASSEMBLY FOR SECURING ELECTRONIC EQUIPMENT WITHIN AN EQUIPMENT RACK, which is incorporated by reference herein in its entirety.

BACKGROUND OF DISCLOSURE

1. Field of Disclosure

Embodiments of the disclosure relate generally to locking systems, and more specifically, to a locking assembly that is used to secure electronic equipment within an equipment rack and to prevent unwanted removal and installation of the electronic equipment from the equipment rack.

2. Discussion of Related Art

Centralized data centers for computer, communications and other electronic equipment have been in use for a number of years. More recently, with the increasing use of the Internet, large scale data centers that provide hosting services for Internet Service Providers (ISPs), Application Service Providers (ASPs) and Internet content providers have become increasingly popular. It is often desirable to operate equipment within data centers seven days a week, 24 hours per day, with little or no disruption in service. To prevent any disruption in service, it is common practice in data centers to use uninterruptible power supplies (UPSs) provided in equipment racks to ensure that the equipment within the data centers receives continuous power throughout any black out or brown out periods. Typically, data centers are equipped with a relatively large UPS at the main power distribution panel for the facility. Often, the UPS is selected to have sufficient capacity to meet the power requirements for all of the equipment within the facility.

The use of the UPS to provide power to a critical load is well known in the art. The UPS is designed to protect electronic equipment from utility power blackouts, brown-outs, sags and surges. The UPS may also protect electronic equipment from small utility fluctuations and large disturbances. In most rack configurations, the UPS provides battery backup until utility power returns to safe levels or the batteries are fully discharged. The configurable rack may include power distribution modules and batteries to form the UPS, and other pieces of equipment required to operate the uninterruptible power supply. These modules are rack-mounted in the well-known manner.

FIG. 1 illustrates a partial view of a typical modular power distribution unit (mPDU) 10. The power distribution unit consists of a rack frame chassis and removable power distribution modules (PDMs) 20. FIG. 2 illustrates an exemplary power distribution module 20. In order to install or remove a power distribution module from the power distribution unit, the operator needs to open a latch provided on a front surface of the power distribution module 20, which is illustrated in FIG. 3. To safely remove the power distribution module, the operator should power OFF the power distribution module. However, existing power distribution modules can be removed when the power distribution module is powered ON, via the host PDU. There are warning messages in instruction manuals to warn operators not to install or remove the modules while the power is ON in the main unit.

SUMMARY OF DISCLOSURE

One aspect of the present disclosure is directed to a locking assembly for securing an electronic module to a chassis of a rack enclosure within a mounting slot of the chassis. In one embodiment, the locking assembly comprises a lock configured to be secured to a vertical rail of the chassis. The lock further is configured to prevent the electronic module from being slidably installed into and removed from its respective mounting slot and to prevent a latch of the electronic module from being opened when the electronic module is secured in place within the chassis of the rack enclosure. The locking assembly further comprises a key configured to enable the lock to be removed from the chassis thereby enabling the installation and removal of the electronic module from the chassis.

Embodiments of the locking assembly further may include securing the lock to the chassis by a snap-fit configuration. The lock further may include a rectangular body having a front surface, a back surface, and two openings formed in the body. The lock further may include two protrusions, which are positioned at respective corners of the body and extend from the back surface of the body, to position the lock with respect to the chassis when installing the lock on the chassis. The lock further may include two fingers, which extend from the back surface of the body from the strip. Each finger may include a keyhole that is configured to receive the key. Each keyhole may extend axially through the finger. The key may include two elongated arms, one for each keyhole. Each arm may include a respective tab portion, which functions as a grip when moving the arms toward one another. Each finger may include a portion that engages the rail of the chassis to prevent the lock from being removed from the chassis once the lock is snap-fitted in place. The lock may include an edge portion configured to engage an edge of the electronic module, which prevents the latch from being opened.

Another aspect of the present disclosure is directed to a method of releasably locking an electronic module to a chassis of a rack enclosure within a mounting slot of the chassis. In one embodiment, the method comprises securing a lock to a vertical rail of the chassis of the rack enclosure.

Embodiments of the method further may include the lock having a surface configured to engage an edge of the electronic module, which prevents a latch of the electronic module from being opened. The lock may be secured to the chassis by a snap-fit configuration. The lock may include a rectangular body having a front surface, a back surface, and two openings formed in the body. The method further may comprise releasing the lock from the chassis by inserting a key configured to enable the lock to be removed from the chassis thereby enabling the removal of the electronic module from the chassis. The lock may include two fingers, which extend from the back surface of the body from the strip. Each finger may include a keyhole that is configured to receive the key. The key may include two elongated arms, one for each keyhole, and wherein the method further includes inserting the arms into respective keyholes. The method further may comprise moving the arms toward one another and moving the lock away from the chassis.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
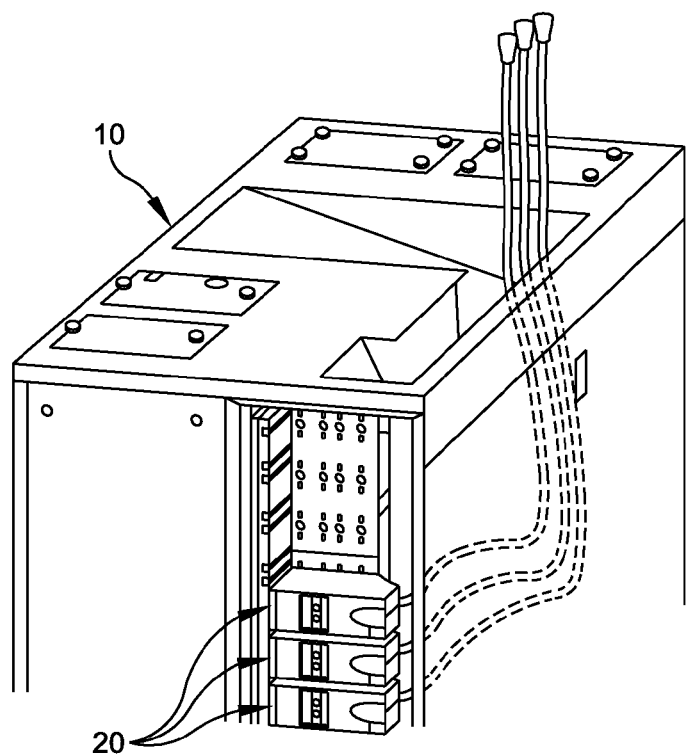
FIG. 1 is a partial perspective view of a power distribution unit having a plurality of power distribution modules installed within the power distribution unit.
Figure 2:
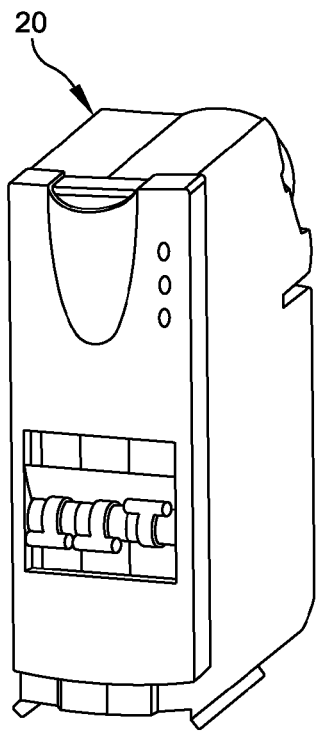
FIG. 2 is a perspective view of the power distribution module with a latch of the power distribution module shown in a closed position.
Figure 3:
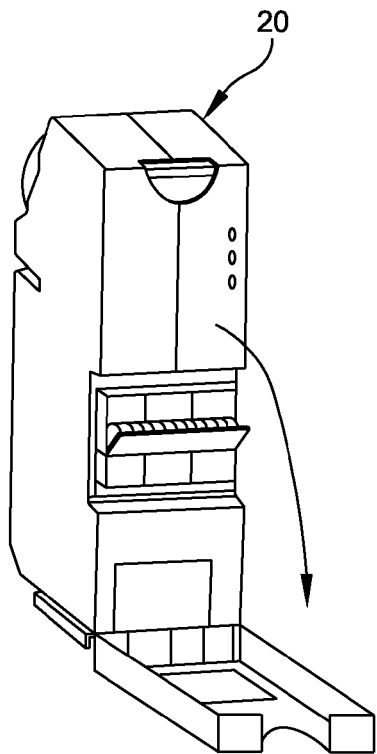
FIG. 3 is a perspective view of the power distribution module with the latch shown in an open position.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

This present disclosure is directed to a lock and key assembly that is configured to secure a power distribution module within a power distribution unit and to prevent the removal of the power distribution module when the power distribution module is powered ON. In a certain embodiment, several locks are installed during assembly of the power distribution unit, which prevent an operator at a customer site from opening a latch the power distribution module. The operator must use a special key to remove the lock in order to remove or to install a new module within the power distribution unit. The provision of the lock and key assembly ensure proper operation procedures are followed when installing and removing the power distribution modules within the power distribution unit.

Figure 4:
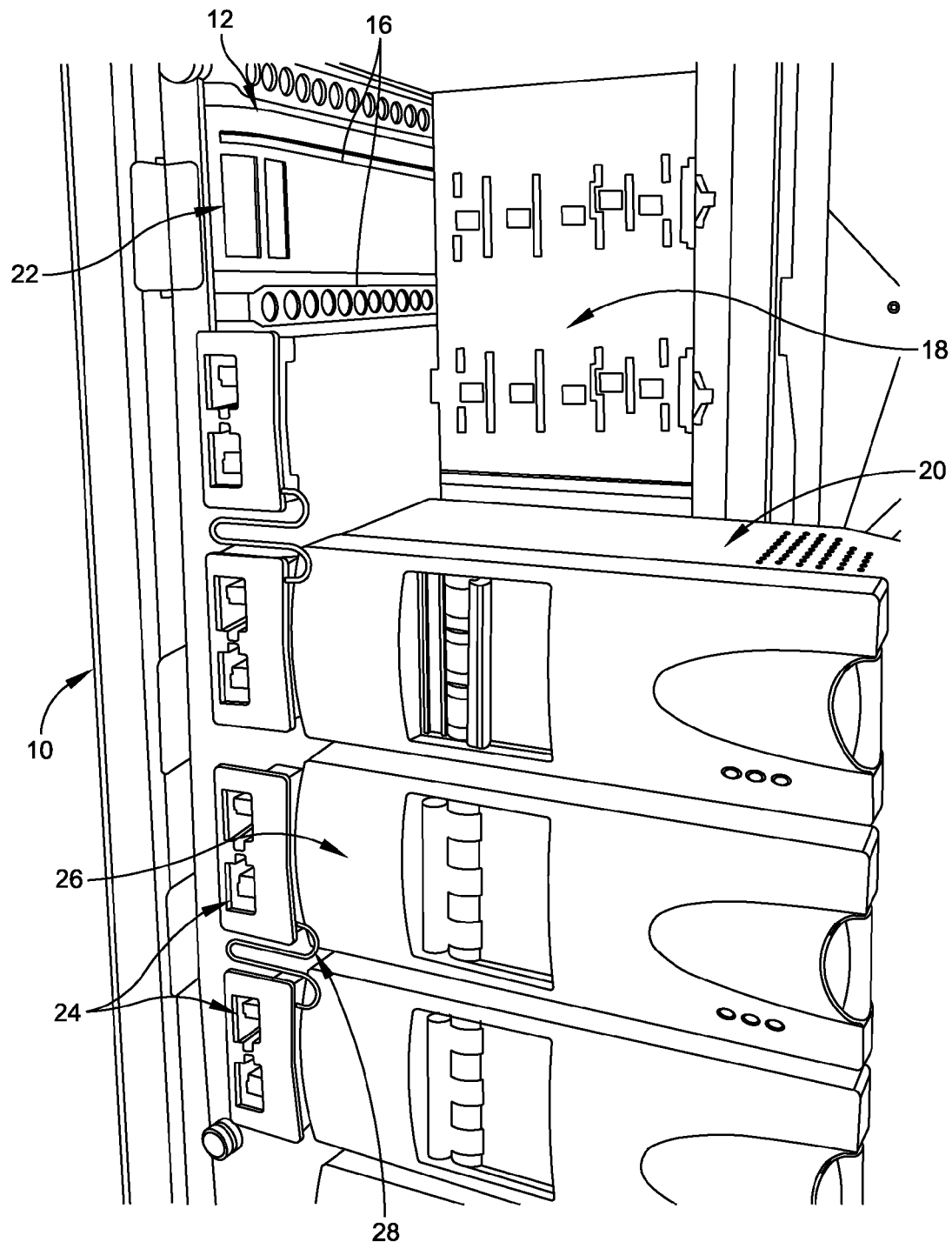
FIG. 4 is a front perspective view of several power distribution modules installed within the power distribution unit with the locks serving to secure the power distribution modules in place.
Figure 5:
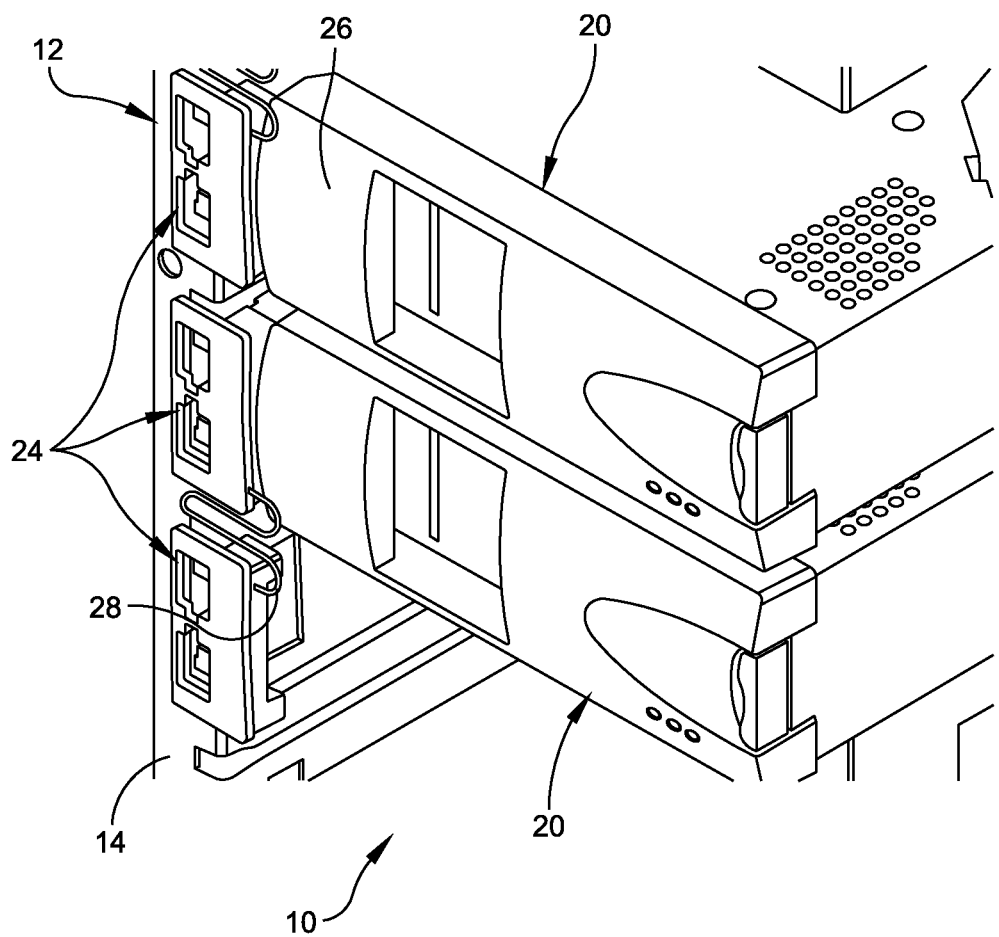
FIG. 5 is a perspective view of the power distribution modules and the power distribution unit with internal portions removed.

Referring now to the drawings, and more particularly to FIGS. 1, 4 and 5, a portion of a rack enclosure is generally indicated at 10. The rack enclosure 10 is constructed in the well-known manner. As shown, the rack enclosure 10 includes a chassis, or frame structure, generally indicated at 12, having a vertical rail 14 and a back plate 18. The chassis further includes a pair of slots 16 that is configured to slidably receive electronic components to be engaged to the back plate 18 in the well-known manner. In the shown embodiment, the rack enclosure 10 is configured to support a plurality of power distribution modules, each generally indicated at 20. In particular, the rack enclosure 10 includes multiple mounting slots, each indicated at 22, sometimes called bays, with each bay being configured to hold the power distribution module 20 in place. As shown, the power distribution modules 20 provided within the rack enclosure 10 are stacked one above the other.

As shown in FIGS. 4 and 5, in one embodiment, a lock generally indicated at 24 is provided to secure a single power distribution module 20 in place. The lock 24 is secured to the vertical rail 14, and is configured to prevent a latch 26 of the power distribution module from being opened and the power distribution module 20 from being slidably removed from its mounting slot 22 when the power distribution module is secured in place within the rack enclosure 10. In one embodiment, the lock 24 serves as a slide gate. When assembling the rack enclosure 10, the locks 24 are installed in all of the mounting slots 22, whether a power distribution module 20 is installed. The lock 24 serves as a slide gate for the open slot 22. Thus, in order to install a new power distribution module 20 on site, an operator has to unlock the lock 24 in the manner described below, insert the power distribution module 20, and then reinstall the lock. Adjacent locks 24 may be tethered to one another with a ribbon or wire 28, which is provided to prevent the lock from being unintentionally discarded when removed from the rack enclosure 10. The lock 24 may be fabricated from any number of materials, including plastic and metal materials.

Figure 6C:
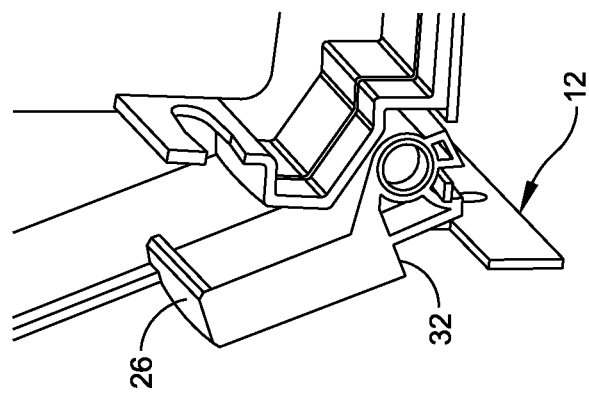
FIG. 6C is a partial perspective view from below of the power distribution module and the power distribution unit shown in FIGS. 6A and 6B with the lock removed.
Figure 6B:
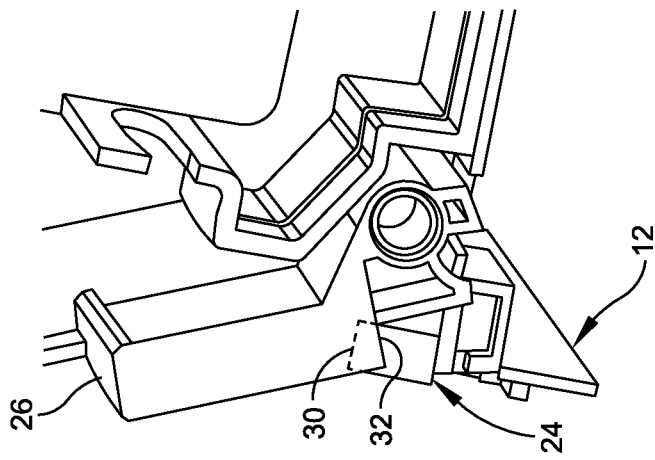
FIGS. 6A and 6B are partial perspective views from below showing the operation of the lock to prevent the removal of the power distribution module from the power distribution unit.
Figure 6A:
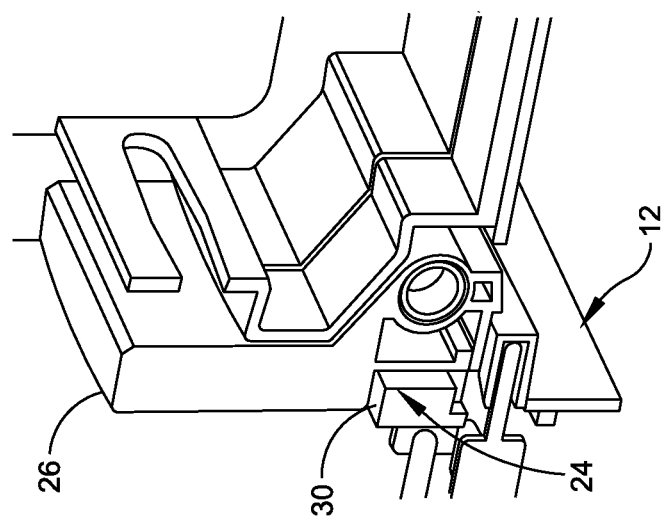

Referring to FIGS. 6A, 6B, and 6C, in addition to preventing the power distribution module 20 from being removed from the rack enclosure 10, the lock 24 functions as a jam lock to prevent the latch 26 of the power distribution module from opening when the power distribution module is secured within its respective mounting slot 22. The lock 24 includes an edge portion 30 configured to engage an edge 32 of the latch 26 of the power distribution module 20, which prevents the latch 26 from being opened. FIG. 6A illustrates the edge portion 30 engaging the edge 32 of the latch 26 of the power distribution module 20. FIG. 6B illustrates the latch 26 of the power distribution module 20 being opened, with the edge 32 of the latch engaging the edge portion 30 of the lock 24 to prevent the latch from being completely opened to access a control panel of the power distribution module. FIG. 6C illustrates the lock 24 removed from the chassis 12 of the rack enclosure 10, thus allowing the latch 26 of the power distribution module 20 to be opened. When the lock 24 is removed, the latch 26 can be opened to enable the removal of the power distribution module 20 from the chassis 12 of the rack enclosure.

Figure 7:
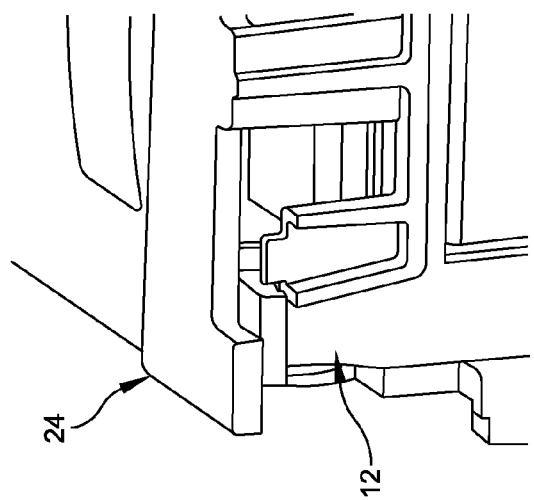
FIG. 7 is a partial perspective view of a chassis of the power distribution unit.

Referring to FIG. 7, in one embodiment, the lock 24 is secured to the chassis 12 of the rack enclosure 10 by a snap-fit configuration associated with the lock. The lock 24 is positioned on the vertical rail 14 of chassis 12 to engage latch 26 of the power distribution module 20 to prevent the power distribution module from being removed from its respective mounting slot 22 and to prevent the latch of the power distribution module from being opened. The manner in which the lock 24 is secured to the chassis 12 of the rack enclosure 10 will be described in greater detail below.

Figure 8A:
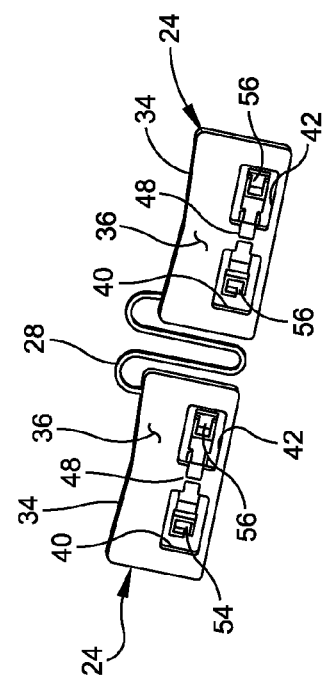
FIG. 8A is a front perspective view of a lock of an embodiment of the present disclosure.
Figure 8B:
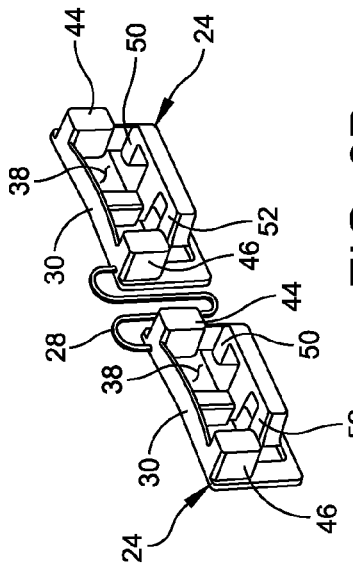
FIG. 8B is a back perspective view of the lock illustrated in FIG. 8A.

Specifically, with additional reference to FIGS. 8A and 8B, in which FIG. 8A illustrates a front of two locks 24 and FIG. 8B illustrates a back of the two locks, each lock includes a rectangular body 34 having a front surface 36, a back surface 38, and two openings indicated at 40, 42 formed in the body. The shape and construction of the lock 24 may be changed depending on the shape and operation of the power distribution module 20. As mentioned above, the ribbon 28 serves as a retaining wire to prevent the loose lock 24 to be discarded unintentionally. It is recommended that only one lock 24 is unlocked at one time. The other adjacent lock 24 will still be attached to the chassis 12.

FIG. 8B illustrates the lock 24 having two protrusions 44, 46, which are positioned at respective corners of the body 34 and extend from the back surface 38 of the body. The protrusions 44, 46 are provided to position the lock 24 with respect to the chassis 12 of the rack enclosure 10 when installing the lock on the chassis. The body 34 of the lock 24 includes a strip 48 of material that separates the openings 40, 42. FIG. 8B further illustrates two fingers 50, 52 that extend from the back surface 38 of the body 34 from the strip 48. Each finger 50, 52 includes a respective keyhole 54, 56 that is configured to receive a specially configured key. Each keyhole 54, 56 extends axially through its respective finger 50, 52. As shown, each keyhole 54, 56 is generally square-shaped; however, the keyhole can be formed to embody any shape, including circular-shaped and rectangular-shaped.

Figure 9:
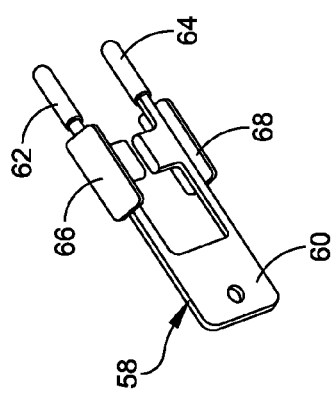
FIG. 9 is a perspective view of a key that is used with the lock.

Referring to FIG. 9, in one embodiment, a key, generally indicated at 58, is specially configured to remove the lock 24 from the chassis 12 of the rack enclosure 10. Although the key 58 is provided to remove the lock 24 from the chassis 12 only, the lock and key assembly may be configured to install and remove the key from the chassis. In one embodiment, the key 58 includes a main body portion 60 and a two elongated arms 62, 64, one for each keyhole 54, 56, which extend from the main body portion. Each arm 62, 64 includes a respective tab portion 66, 68, which functions as a grip when moving the arms toward one another. The arrangement is such that the arms 62, 64 of the key 58 are resilient with respect to the main body portion 60 so that the arms may be manipulated toward one another when applying a force to the tab portions 66, 68. As with the lock 24, the key 58 may be fabricated from any number of materials, including plastic and metal materials.

Figure 10:
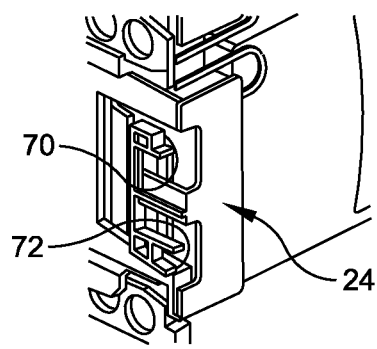
FIG. 10 is a partial perspective view showing the installation of the lock on the chassis.
Figure 11:
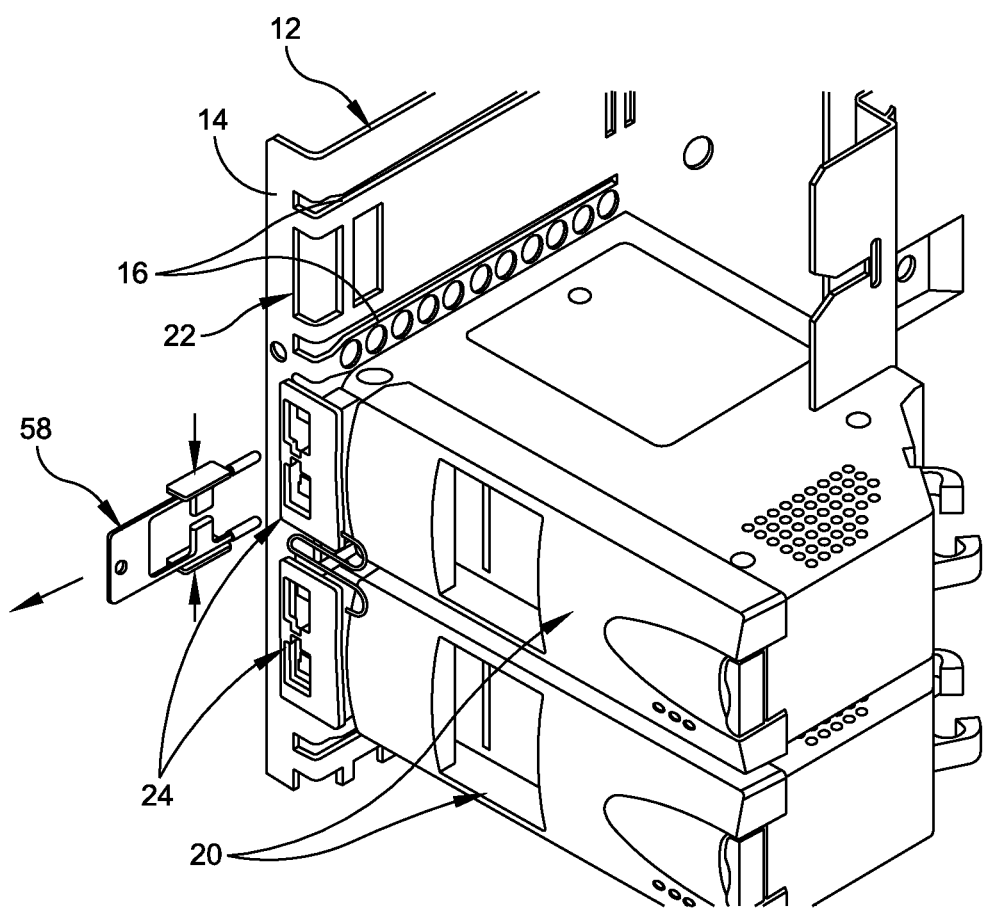
FIG. 11 is a partial perspective view of the key prior to being inserted into the lock.
Figure 12:
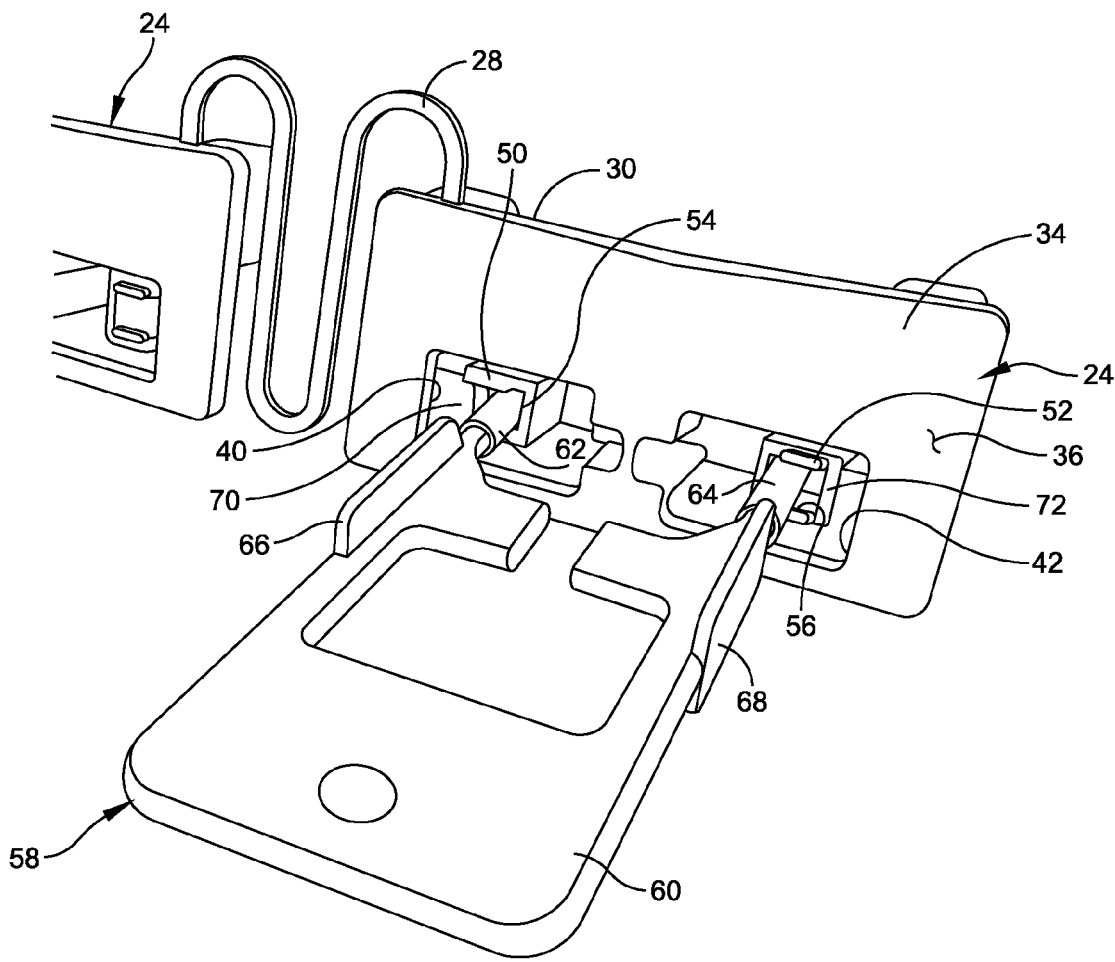
FIG. 12 is an enlarged perspective view of the key prior to being inserted into the lock.

FIG. 10 illustrates the snap-fit insertion of the lock 24 on the vertical rail 14 of the chassis 12 of the enclosure 10. To install the lock 24, a force is applied on the front surface 36 of the body 34 of the lock to snap the lock into the chassis 12 (engaged on two sides). Each finger 50, 52 includes a portion 70, 72 that engages the vertical rail 14 of the chassis 12 to prevent the lock 24 from being removed from the chassis once the lock is snap-fitted in place. FIG. 11 illustrates the key 58 prior to being inserted into the lock 24. As shown, the arms 62, 64 of the key 58 are aligned with the keyholes 54, 56 of the fingers 50, 52. The arms 62, 64 of the key 58 are inserted into respective keyholes 54, 56 of the fingers 50, 52 until the arms are fully received within the keyholes. FIG. 12 illustrates the arms 62, 64 of the key 58 being received with the keyholes 54, 56 of the fingers 50, 52.

Figure 13:
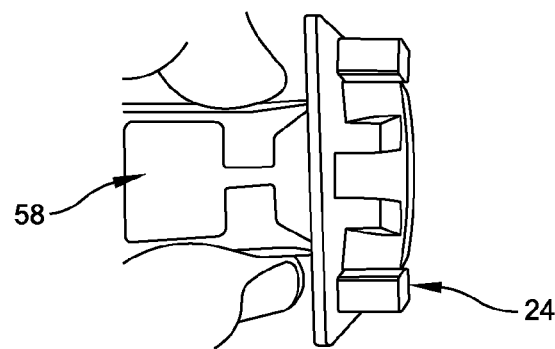
FIG. 13 is a side elevational view of the manipulation of the key to unlock the lock.

FIG. 13 illustrates a force applied by a person's hand to move the arms 62, 64 of the key 58 toward one another thereby moving the fingers 50, 52 of the lock 24 toward one another. In particular, a force is applied to fingers 50, 52 of the lock 24 by the key 58 in which the arms 62, 64 of the key are squeezed to move the arms inward. The force of moving the arms 62, 64 of the key 58 toward one another causes the fingers 50, 52 of the lock 24 to be moved toward one another as well. The resultant movement of the fingers 50, 52 causes the portions 70, 72 of the fingers to disengage from the vertical rail 14 of the chassis 12, thereby enabling the lock 24 to be removed from the chassis.

The lock and key assembly is designed to steer operators to steer operators toward NFPA 70E behavior for module power distribution units. The lock and key assembly is configured to lock the power distribution modules in place while power is ON and to unlock the modules for removal when required. The lock and key assembly also prevents a new power distribution module to be installed until the lock is removed. The lock and key assembly includes a snap-in lock and a special key. With the assembly of the present disclosure, the locks are factory installed, which prevent operators at customer sites to open the module latch. The operators must use the special key to remove the lock in order to remove or to install a new module. The old approach was communicating the warnings by documentation and labels. The new assembly included in this disclosure provides a mechanical solution reinforcement.

Advantages of the lock and key assembly include mechanical construction of the snap-in lock, multiple locks ganged by two, to limit neglect or loss, mechanical construction of the key, how the lock and key work together, a less passive (or more active) way than a label to encourage compliance with instructions, jam lock, forbids arm swing of PDM (forbids opening module latch), and slide gate, forbids insertion of PDM.

Although embodiments of the present disclosure illustrate power distribution modules being installed into and removed from the equipment rack, it should be understood that any type of electronic module or device may benefit from the being used with the lock and key assembly in a manner similar to the power distribution module.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A locking assembly for securing an electronic module to a chassis of a rack enclosure within a mounting slot of the chassis, the electronic module including a latch having an edge, the locking assembly comprising:
   a lock configured to be secured to a vertical rail of the chassis, the lock further being configured to prevent the electronic module from being slidably installed into and removed from its respective mounting slot and to prevent the latch of the electronic module from being opened when the electronic module is secured in place within the chassis of the rack enclosure, the lock including a main body having first and second openings, a strip portion separating the first and second openings, first and second protrusions configured to position the lock with respect to the chassis when installing the lock to the chassis, an upper edge portion provided along an upper edge of the main body and configured to engage the edge of the latch of the electronic module to prevent the latch of the electronic module from being opened when the lock is secured to the vertical rail of the chassis, and first and second fingers extending from the main body and configured to engage the rail of the chassis to prevent the lock from being removed from the chassis; and a key configured to enable the lock to be removed from the chassis thereby enabling the installation and removal of the electronic module from the chassis.

2. The locking assembly of claim 1, wherein the lock is secured to the chassis by a snap-fit configuration.

3. The locking assembly of claim 2, wherein the main body of the lock is rectangular in shape, having a front surface and a back surface.

4. The locking assembly of claim 3, wherein the two protrusions of the lock are positioned at respective corners of the main body and extend from the back surface of the main body.

5. The locking assembly of claim 3, wherein the first and second fingers extend from the back surface of the main body from the strip portion.

6. The locking assembly of claim 5, wherein each finger includes a keyhole that is configured to receive the key.

7. The locking assembly of claim 6, wherein each keyhole extends axially through the finger.

8. The locking assembly of claim 6, wherein the key includes two elongated arms, one for each keyhole.

9. The locking assembly of claim 8, wherein each arm includes a respective tab portion, which functions as a grip when moving the arms toward one another.

10. The locking assembly of claim 5, wherein each finger includes a portion that engages the rail of the chassis to prevent the lock from being removed from the chassis once the lock is snap-fitted in place.

11. A method of releasably locking an electronic module to a chassis of a rack enclosure within a mounting slot of the chassis, the electronic module including a latch having an edge, the method comprising:

securing a lock to a vertical rail of the chassis of the rack enclosure; and releasing the lock from the chassis by inserting a key configured to enable the lock to be removed from the chassis thereby enabling the removal of the electronic module from the chassis, wherein the lock includes a main body having first and second openings, a strip portion separating the first and second openings, first and second protrusions configured to position the lock with respect to the chassis when installing the lock to the chassis, an upper edge portion provided along an upper edge of the main body and configured to engage the edge of the latch of the electronic module to prevent the latch of the electronic module from being opened when the lock is secured to the vertical rail of the chassis, and first and second fingers extending from the main body and configured to engage the rail of the chassis to prevent the lock from being removed from the chassis.

12. The method of claim 11, wherein the lock is secured to the chassis by a snap-fit configuration.

13. The method of claim 11, wherein the main body of the lock is rectangular in shape, having a front surface and a back surface.

14. The method of claim 11, wherein the first and second fingers extend from the back surface of the main body from the strip portion.

15. The method of claim 14, wherein each finger includes a keyhole that is configured to receive the key.

16. The method of claim 15, wherein the key includes two elongated arms, one for each keyhole, and wherein the method further includes inserting the arms into respective keyholes.

17. The method of claim 16, further comprising moving the arms toward one another and moving the lock away from the chassis.

* * * * *